(12) United States Patent
Ba et al.

(10) Patent No.: US 12,094,560 B2
(45) Date of Patent: Sep. 17, 2024

(54) APPARATUSES AND METHODS FOR ACCURATE BIAS TEMPERATURE INSTABILITY MITIGATION

(71) Applicant: MICRON TECHNOLOGY, INC., Boise, ID (US)

(72) Inventors: Huipeng Ba, Boise, ID (US); Yuan He, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 212 days.

(21) Appl. No.: 17/812,102

(22) Filed: Jul. 12, 2022

(65) Prior Publication Data

US 2024/0021222 A1    Jan. 18, 2024

(51) Int. Cl.
  *G11C 11/00*  (2006.01)
  *G11C 7/04*   (2006.01)
  *G11C 7/22*   (2006.01)

(52) U.S. Cl.
  CPC ............ *G11C 7/04* (2013.01); *G11C 7/222* (2013.01)

(58) Field of Classification Search
  CPC .................................. G11C 7/04; G11C 7/222
  See application file for complete search history.

(56) References Cited

U.S. PATENT DOCUMENTS

| | | | | |
|---|---|---|---|---|
| 10,114,068 | B1* | 10/2018 | Chen | G01R 31/2879 |
| 2014/0312961 | A1* | 10/2014 | Seo | G11C 7/04 |
| | | | | 327/513 |
| 2022/0268837 | A1* | 8/2022 | Leong | G01R 31/2849 |

* cited by examiner

*Primary Examiner* — Pho M Luu
(74) *Attorney, Agent, or Firm* — Dorsey & Whitney LLP

(57) ABSTRACT

Apparatuses, systems, and methods for accurate bias temperature instability (BTI) mitigation. During a first period a signal is provided to a path of a device, and during a second period a BTI toggle signal is provided to the path. During the first period a ratio of the time that the signal is active or inactive is measured. During the second period the BTI toggle signal is provided with a duty cycle based on the measured ratio. The duty cycle may be higher if the measured ratio is lower and lower if the measured ratio was higher.

18 Claims, 8 Drawing Sheets

US 12,094,560 B2

APPARATUSES AND METHODS FOR ACCURATE BIAS TEMPERATURE INSTABILITY MITIGATION

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). When accessed, the memory cell may be coupled to a digit line (or bit line), and a voltage on the digit line may change based on the information stored in the coupled memory cell.

Bias temperature instability (BTI), such as negative bias temperature instability (NBTI) and positive bias temperature instability (PBTI) may cause degradation in a transistor where a voltage is applied to the gate of the transistor for a long time. The degradation may cause the transistor to favor high or low voltages if a constant voltage is applied to the transistor, which may in turn distort the waveforms of signals passing through those transistors. The memory may perform BTI mitigation to evenly wear the transistors so that the transistor's performance remains balanced.

DETAILED DESCRIPTION

Figure 1:
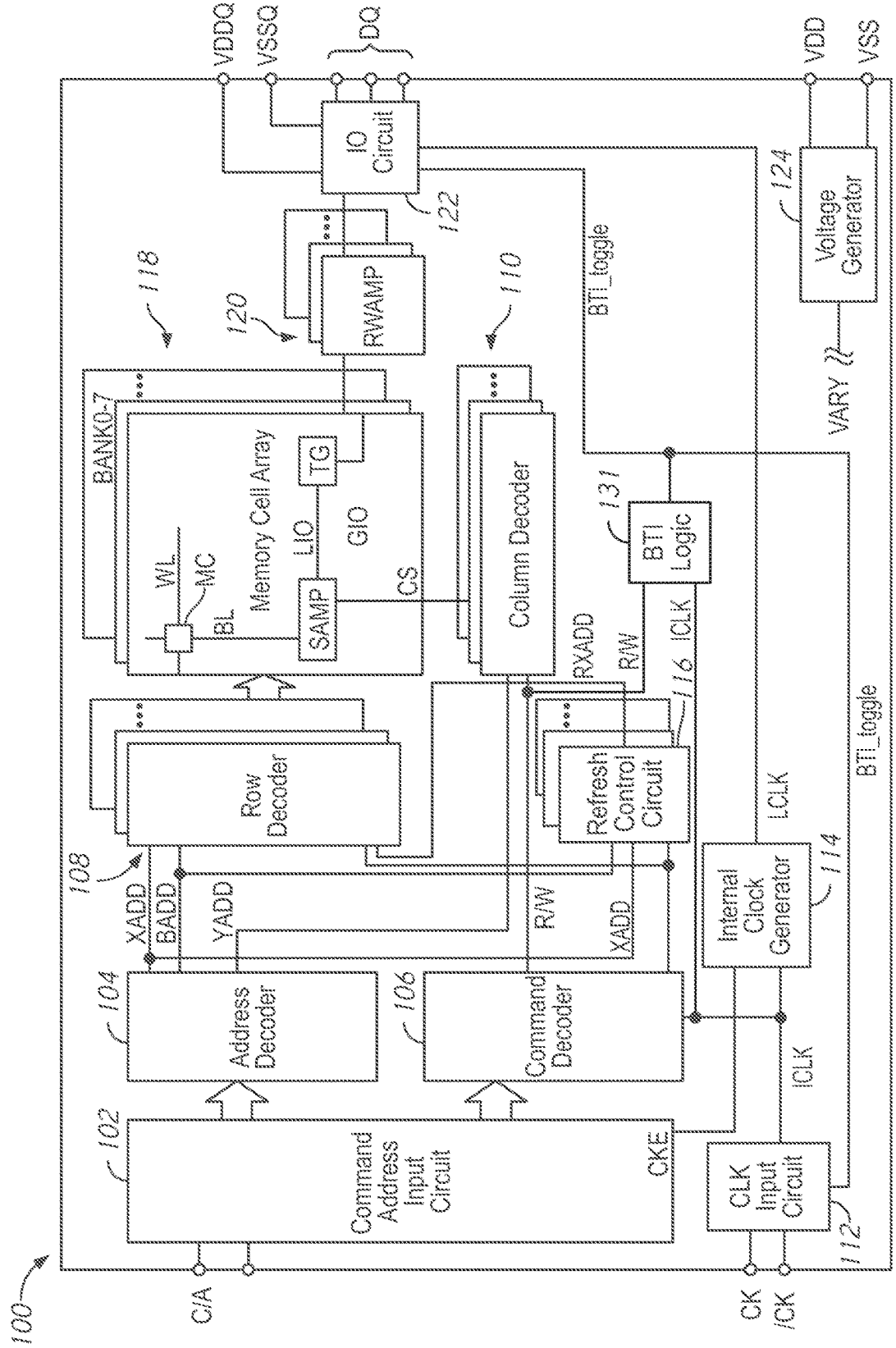
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory arrays may generally include a number of memory cells arranged at the intersection of word lines (rows) and bit lines/digit lines (columns). During a read operation, the memory may receive a read command and row and column addresses which indicate which memory cell(s) data should be read from. The data is provided to output buffers, and read off from input/output (DQ) pads of the memory. The memory device may include a number of transistors, which may be subject to BTI. Over time, if the BTI is not mitigated, there may be a distortion in various signals which may cause errors in the operation of the memory.

For example, operations in the memory may be synchronized to a clock signal. A data path includes a number of latches which latch commands, addresses, and/or data and provide it in synchronization with a clock signal. A clock path may receive a clock signal and distribute it through the memory to the data latches. If the transistors along the clock path are subject to an uneven amount of BTI, the rapid oscillation of the clock signal may make the waveform of the clock signal especially prone to distortion as it passes along the clock path. For example, if the clock path undergoes BTI such that higher voltages are favored, the duty cycle of the clock signal may increase.

The memory may attempt to mitigate BTI by ensuring that when operations are not being performed (e.g., in a standby mode of the device) alternating voltages are applied to key transistors to prevent them from undergoing uneven BTI degradation. The memory includes BTI logic which provides a periodic BTI signal. The periodic BTI signal may be provided to various components of the memory which are particularly susceptible to the effects of BTI, such as a clock path and/or data path when the system is in a standby mode. The periodic BTI signal may ensure that in the standby mode a constant voltage is not applied to the paths. However, in order to ensure even BTI wear on the transistors, it may be desirable to adjust the BTI toggle signal to take into account the ratio of high to low signals applied to the path during an operational mode.

The present disclosure is drawn to apparatuses, systems, and methods for accurate BTI mitigation. An example device of the present disclosure may measure a ratio of time that a signal, such as a clock signal is active or inactive during a measurement period of the device. During a mode of the device where there is BTI stress, such as a standby mode, a periodic BTI toggle signal is provided in place of the signal during BTI compensating periods. The device may alternate between measurement and BTI compensating periods while the device is in the BTI stress mode. The device may be in a measurement period during the operational mode. The duty cycle of the BTI toggle signal is set based on the measured ratio. For example, if the ratio is high (e.g., the signal was mostly active during the operational mode) then the duty cycle of the BTI toggle signal may be lowered. If the measured ratio was low (e.g., the signal was mostly inactive during the operational mode) then the duty cycle of the BTI toggle signal may be raised. In this way, the BTI toggle signal may respond to the ratio of active to inactive signals provided during the measurement period, such that the overall amount of active and inactive signals (e.g., high and low voltages) provided during the BTI stress mode are closer to even in order to ensure more even BTI degradation of the transistors.

For example, the device may include a BTI circuit which receives the signal. The BTI circuit includes a bi-directional counter which changes a count value in a first direction (e.g., increases the count value) when the signal is active and changes the count value in a second direction (e.g., decreases the count value) when the signal is inactive during the measurement period. In some embodiments, the BTI circuit may include a filter, such as a low pass filter, to even out rapid or brief changes in the signal, and the filtered signal may be provided to the bi-directional counter Based on the count value, a duty cycle of the BTI toggle signal may be set during the BTI compensating period.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments.

Each memory bank includes a plurality of word lines WL, a plurality of bit lines BL, and a plurality of memory cells MC arranged at intersections of the plurality of word lines WL and the plurality of bit lines BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. In some embodiments, components such as the row and column decoders and refresh control circuit 116 which are repeated on a per-bank basis may also include components which are repeated on a per-sub-bank basis. For example, there may be a refresh control circuit 116 for each sub-bank.

The bit lines BL are coupled to a respective sense amplifier (SAMP). Read data from the bit line BL is amplified by the sense amplifier SAMP, and transferred to read/write amplifiers 120 over local data lines (LIO), transfer gate (TG), and global data lines (GIO). Conversely, write data outputted from the read/write amplifiers 120 is transferred to the sense amplifier SAMP over the complementary main data lines GIO, the transfer gate TG, and the complementary local data lines LIO, and written in the memory cell MC coupled to the bit line BL.

The semiconductor device 100 may employ a plurality of external terminals, such as solder pads, that include command and address (C/A) terminals coupled to a command and address bus to receive commands and addresses, clock terminals to receive clocks CK and /CK, data terminals DQ coupled to a data bus to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal CS, which may activate a selected one of the sense amplifiers SAMP. The address decoder 104 may also supply a decoded bank address BADD, which may indicate the bank of the memory array 118 containing the decoded row address XADD and column address YADD. The row address XADD may indicate the sub-bank within the bank indicated by BADD.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 includes refresh control circuits 116 each associated with a bank of the memory array 118. Each refresh control circuit 116 may determine when to perform a refresh operation on the associated bank. The refresh control circuit 116 provides a refresh address RXADD (along with one or more refresh signals, not shown in FIG. 1). The row decoder 108 performs a refresh operation on one or more word lines associated with RXADD. The refresh control circuit 116 may perform multiple types of refresh operation, which may determine how the address RXADD is generated, as well as other details such as how many word lines are associated with the address RXADD. During a self-refresh mode, the memory device 100 may generate a refresh signal based on internal logic and perform refresh operations based on internal timing.

The memory device 100 includes a BTI logic circuit 131 which provides a periodic BTI_toggle signal during certain modes of the memory device 100 where there is potential BTI stress, such as a standby mode, during a self-refresh mode, a reset mode, an idle mode, etc. During other modes, such as operational modes (e.g., when access operations are being performed), the BTI_toggle signal may not be provided. The BTI_toggle signal may be used during BTI compensating periods when the device is in BTI stress mode to alleviate or mitigate BTI degradation of one or more transistors of the device. For example, the BTI_toggle signal may be provided along a clock path (e.g., from clock input circuit 112 through the internal clock generator 114 to the IO circuits 122) and/or a data path (e.g., within the IO circuit 122). In other words, a given path may receive a signal, such as ICLK during the operational mode, and may receive the BTI toggle signal during BTI compensating periods in the BTI stressmode. The BTI logic 131 generates the BTI_toggle signal during BTI compensating periods with a duty cycle based on the signal received during measurement periods of the BTI stress mode. The BTI logic 131 may determine the BTI compensating periods and the measurement periods. For example the BTI logic 131 may alternate between the periods.

The BTI logic circuit 131 receives a signal during the measurement period and measures a ratio of the time that signal is active. During the BTI compensating period, the BTI_toggle signal is provided with a duty cycle based, at least in part, on the measured ratio of the signal. For example, the BTI logic circuit may receive read and write commands R/W during the measurement period. During that measurement period (or an operational mode) the read and write commands are measured to determine a ratio of the time the signals are active to inactive. During the BTI compensating mode, the BTI_toggle signal is provided along a command and/or data path that the R/W signal was provided along, and the BTI_toggle signal has a duty cycle based on the measured ratio of the R/W signal during the measurement period (or an operational mode). In another example, the BTI logic circuit 131 may receive a high speed clock, such as a data clock (e.g., included in ICLK) and may measure a ratio of time the clock is active to inactive. During the BTI compensating mode, the signal BTI_toggle may be provided along a clock and/or data path that the high speed clock was passed along, and the BTI_toggle signal has a duty cycle based on the measured ratio.

In some embodiments, the BTI logic 131 may receive multiple signals and provide multiple BTI_toggle signals along different paths. For example, the BTI logic circuit 131 may receive both R/W and ICLK and provide two different BTI toggle signals, each with a duty cycle based on a measured ratio of a respective one of R/W and ICLK.

The power supply terminals are supplied with power supply potentials VDD and VSS. The power supply potentials VDD and VSS are supplied to an internal voltage generator circuit 124. The internal voltage generator circuit 124 generates various internal potentials VARY, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
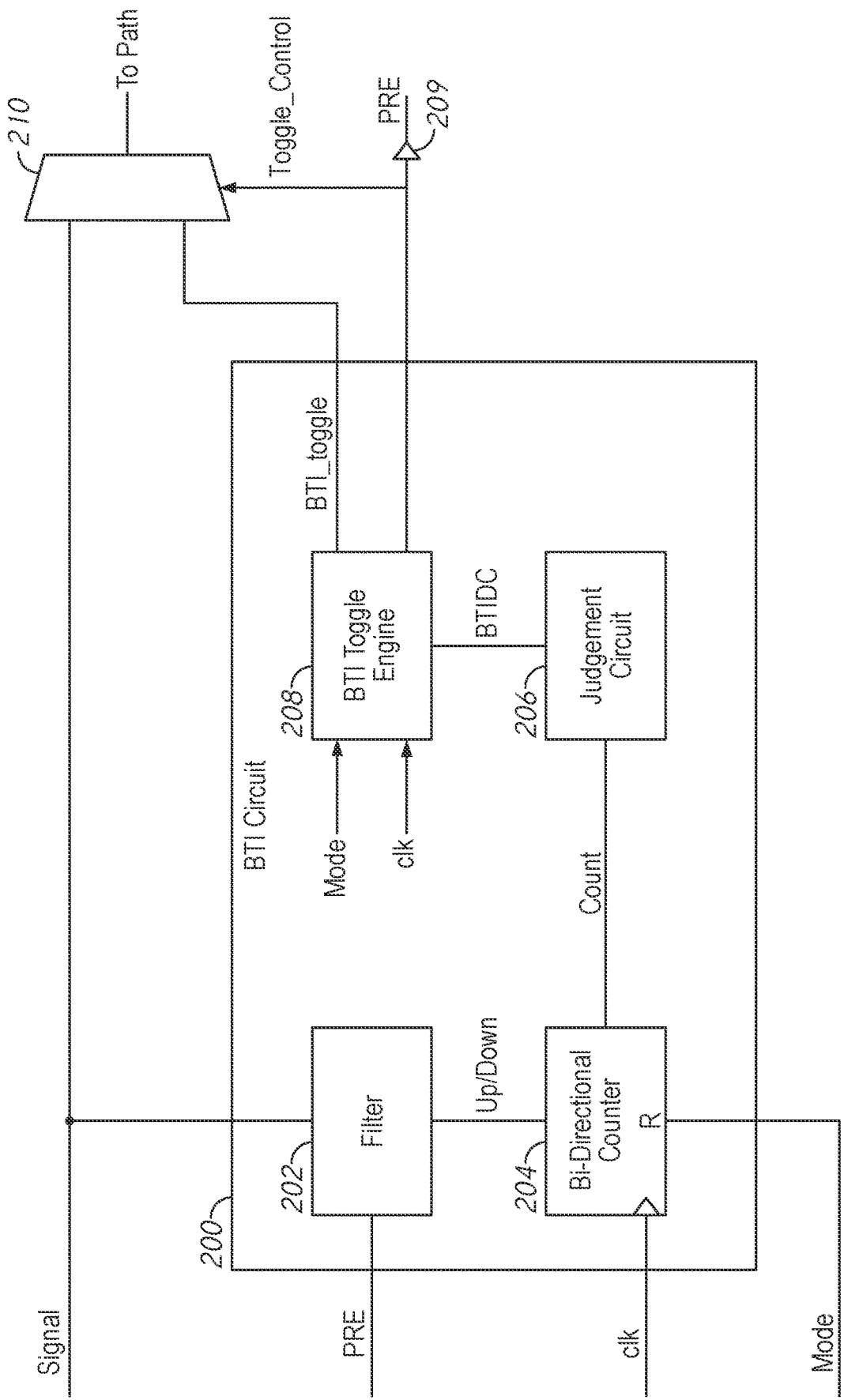
FIG. 2 is a block diagram of BTI logic circuit according to some embodiments of the present disclosure.

FIG. 2 is a block diagram of BTI logic circuit according to some embodiments of the present disclosure. The BTI logic circuit 200 of FIG. 2, may, in some embodiments, be included in the BTI logic circuit 131 of FIG. 1. The BTI logic circuit 200 receives a signal and during a BTI compensating period provides a BTI toggle signal BTI_toggle with a duty cycle based on a measured activity ratio of the signal during a measurement period. The BTI logic 200 provides a BTI toggle control signal Toggle_Control, which determines if the device is in a measurement period (or an operational mode) or a BTI compensating period.

The signal of FIG. 2 represents a signal of the memory where BTI mitigation is performed. For example the signal may be a signal along a path which is particular prone to BTI degradation and/or where BTI degradation may particularly be a problem. For example, the signal may be a high speed clock signal (e.g., ICLK and/or LCLK of FIG. 1) or a command signal (e.g., R/W). Similarly, the path that the signal or the BTI toggle signal BTI_toggle is provided to may be dependent on the signal used. For example, the path may represent a clock path, a data path, and/or a command path of the memory. The generic terms 'signal' and path are used to represent that several signals may have BTI mitigation performed. In some embodiments, the BTI circuit 200 of FIG. 2 may be repeated for each signal of the memory where BTI mitigation is desired.

The BTI logic circuit 200 receives a signal and provides a BTI toggle signal during a BTI compensating period with a duty cycle based on measured properties of the signal during a measurement period (and/or an operational mode of the device). The BTI logic circuit 200 includes a filter which provides a count adjust signal Up/Down based on the signal during the measurement period. During the BTI compensating period, the filter 202 may be disabled and the signal Up/Down may be suppressed. The BTI logic circuit 200 includes a bi-directional counter circuit 204 which adjusts a count value Count based on the count adjust signal Up/Down. A judgement circuit 206 determines a duty cycle based on the count value Count and provides a duty cycle signal BTIDC. A BTI toggle engine circuit 208 provides the BTI toggle signal BTI_toggle with a duty cycle based on the duty cycle signal BTIDC during the BTI compensating period. During measurement period (or during an operational mode of the device) when a signal Toggle_Control is inactive, a multiplexer 210 provides the signal to a path (e.g., provides a clock signal to a clock path). During a BTI compensating period, the multiplexer 210 provides the BTI toggle signal BTI_toggle to the path (e.g., provides BTI_toggle to the clock path).

The filter 202 receives the signal and provides a count adjust signal Up/Down during a measurement period. The filter receives a signal PRE from the BTI toggle engine 208 which indicates if the device is in a measurement period or a BTI compensating period. For example, if the signal PRE is active (e.g., at a logical high) then the filter 202 may be disabled and Up/Down may not be provided, while if the signal PRE is inactive (e.g., at a logical low) then the filter 202 may be active. The filter 202 may act to 'smooth out' or otherwise adjust the raw signal. For example, the filter 202 may include a low pass filter, in order to prevent brief changes in the state of the signal from being passed to the bi-directional counter. In some embodiments, the filter 202 may include passive filtering elements, active filtering elements, or combinations thereof.

The bi-directional counter circuit 204 receives the count adjust signal Up/Down from the filter circuit 202. The bi-direction counter circuit 204 also receives a clock signal clk. The clock signal may be a clock which is active during the standby mode. For example, a self refresh clock, such as srefosc may be used as the clock clk. The bi-directional counter circuit 204 provides a count value Count, which is adjusted each time the clock signal clk activates (e.g., on each rising edge of clk) in a direction based on a value of the count adjust signal Up/Down. For example, if the count adjust signal Up/Down has a high logical level, then the bi-directional count circuit 204 may change a value of Count in a first direction (e.g., increment Count) with each activation of clk. If the count adjust signal Up/Down is at a low logical level when clk activates, then the count value Count may change in a second direction opposite the first (e.g., decrement Count). In this way, the value Count may reflect a ratio of the time in which signal is active. For example, if the signal is generally active (e.g., the ratio of time that the signal is active:inactive is high), then value Count may be higher and if the signal is generally inactive (e.g., the ratio of time that the signal is active:inactive is low), then the value Count may be lower. If the signal has a roughly balanced ratio (e.g., over time it is roughly equally active and inactive) then the count value may be at or around a middle value (e.g., halfway between a maximum and minimum value of Count). The bi-directional counter circuit 204 is coupled to a mode signal, which may reset the count value Count when the device is in the operational mode. In some embodiments, the count value may also be reset during the BTI compensating period. The length of a measurement period may be set, in part, on a size of the count value Count. For example, if the count value Count is a four bit number, then the measurement period may be less than 16 cycles of clk to prevent overflow.

The count value Count is provided to a judgement circuit 206 which determines a duty cycle for the BTI_toggle signal based on the count value Count. For example, the judgement circuit may use thresholding and/or binning to determine the duty cycle. If the count value is higher, then a lower duty cycle (e.g., BTI_toggle is more inactive than active) may be chosen, while if a count value is lower, then a higher duty cycle (e.g., BTI_toggle is active than inactive) may be chosen).

Table 1 shows an example embodiment where the count value is a four bit binary number which is increased when the count adjust signal Up/Down is active and decreased when the count adjust signal is inactive. The example bins and duty cycle ratios shown in Table 1 are for example only, and other bins and ratios may be used in other example embodiments. The column BTI H:L represents a selected duty cycle of the BTI toggle signal expressed as a ratio of time that BTI_toggle signal would be high or low, shown in common units such that the values of the ratio sum to 10 for ease of comparison. For example, BTI H:L of 5:5 represents a 50% duty cycle.

TABLE 1

Example Count values and BTI_toggle Duty Cycles

| Count | BTI H:L |
| --- | --- |
| 0-2 | 8:2 |
| 3-5 | 6:4 |
| 6-9 | 5:5 |
| 10-12 | 4:6 |
| 13-15 | 2:8 |

The judgement circuit 206 provides a signal BTIDC which indicates the selected duty cycle to the BT toggle engine circuit 208, which generates the BTI toggle signal with a duty cycle based on the value of BTIDC during a BTI compensating mode. The BTI toggle engine 208 may include an oscillator circuit which generates a BTI oscillation signal. The BTI toggle engine circuit 208 adjusts a duty cycle of the BTI oscillation signal based on BTIDC to generate the BTI toggle signal BTI_toggle.

The BTI toggle engine 208 also determines when the device is in a BTI compensating mode. For example, the BTI toggle engine 208 receives a Mode signal which indicates when the device is in a mode with BTI stress, such as a standby mode. The BTI toggle engine also receives the clock signal clk (e.g., a self-refresh clock). The BTI toggle engine 208 provides a signal Toggle_Control while Mode signal indicates the device is in a mode with BTI stress with timing based on the clock clk. For example, the BTI toggle engine 208 may provide the signal Toggle_Control with periodic timing based on clk and may alternate between Toggle_Control being active or inactive (e.g., between BTI compensating periods and measurement periods). The signal Toggle_Control is provided through a buffer 209 to provide the signal PRE.

In some embodiments, the BTI logic circuit 200 may include additional logic used to control the BTI toggle. For example, the BTI logic circuit 200 may include logic which determines if the signal is at a single level for an entire measurement period. If the signal is at a single level for the entire measurement period, then the signal BTI_toggle may be provided at the opposite level during the BTI compensating period. For example, if the signal is low, then BTI_toggle may be provided high.

Figure 3:
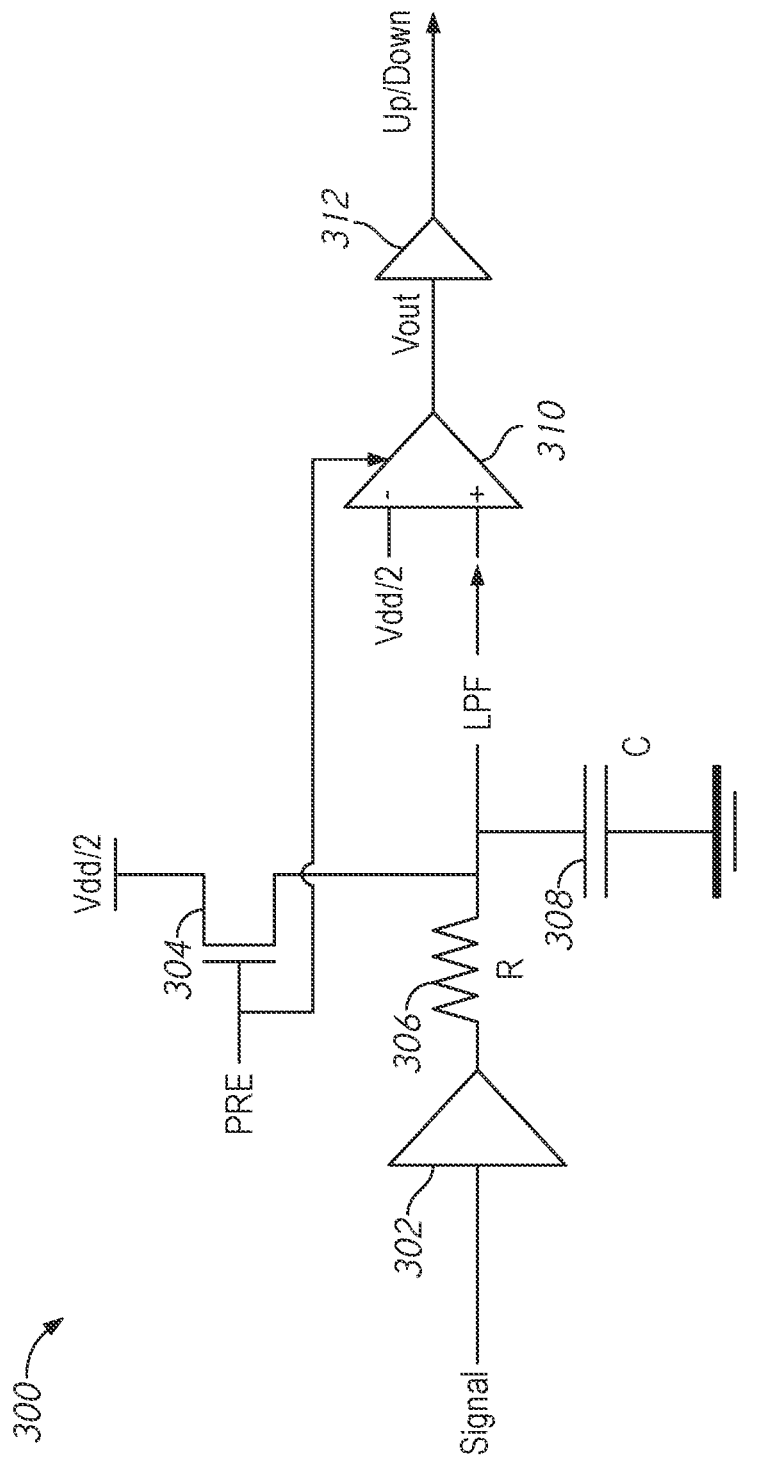
FIG. 3 is a schematic diagram of a filter circuit according to some embodiments of the present disclosure.

FIG. 3 is a schematic diagram of a filter circuit according to some embodiments of the present disclosure. The filter circuit 300 may, in some embodiments, represent an example implementation of the filter circuit 202 of FIG. 2. The filter circuit 300 includes a buffer circuit 302, filtering elements including a resistor 306 and capacitor 308, a comparator circuit 310, and a second buffer 312.

The buffer 302 receives the signal (e.g., Signal of FIG. 2) and provides it to a positive input of the comparator 310 through resistor 306. The positive input of the comparator 310 is also coupled to a ground voltage (e.g., Vss) through a capacitor 308. The resistor 306 and capacitor 308 may act as a low pass filter of the output of the buffer 302 to generate a signal LPF based on signal. The filtered signal LPF is provided to the positive input of the comparator 310.

The comparator 310 has a negative input terminal coupled to a voltage Vdd/2. In the example memory device which includes the filter circuit 300, a ground voltage represents a logical low, while a system voltage Vdd represents a logical high. The voltage Vdd/2 represents a voltage which is approximately halfway between Vdd and the ground voltage. When the voltage of LPF is higher than Vdd/2, then the comparator 310 provides an output Vout at a high logical level. When the voltage LPF is lower than Vdd/2 then the comparator 310 provides the output Vout at a low logical level. The output Vout is passed through a buffer circuit 312 to provide the count adjust signal Up/Down.

In some embodiments, the filter circuit 300 includes a transistor 304 which couples the filtered voltage LPF to the voltage Vdd/2 when a pre-charge signal PRE is active. The signal PRE is provided when the device is in a BTI compensating mode (e.g., when the BTI toggle signal is being provided to the path). The signal PRE is low when the device is in an operational mode or in a measurement period. When the pre-charge signal PRE is active, the comparator 310 may be disabled (to prevent Up/Down from being provided). This may allow the signal LPF to be pre-charged during a BTI mode.

Figure 4:
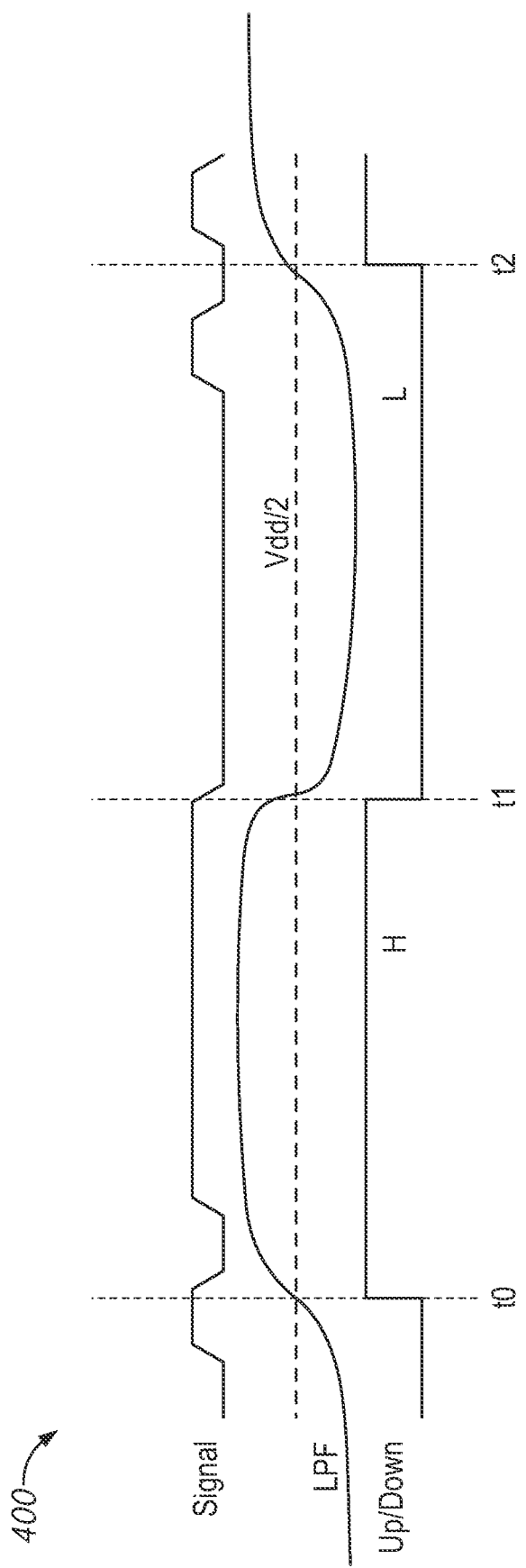
FIG. 4 is a timing diagram of a signal and count adjust signal according to some embodiments of the present disclosure.

FIG. 4 is a timing diagram of a signal and count adjust signal according to some embodiments of the present disclosure. The timing diagram 400 may, in some embodiments, represent an example operation of a filter circuit such as the filter circuit 202 of FIG. 2 and/or 300 of FIG. 3. The timing diagram includes a signal, which in this example may be a command signal (e.g., R/W), a filtered signal after it has passed through a low pass filter LPF, and a count adjust signal Up/Down. The timing diagram 400 represents a measurement period (which may be an operational mode of the device).

Prior to an initial time t0, the signal has started to activate after a period of inactivity. Accordingly, the filtered signal LPF may begin rising. At the time t0, the filtered signal LPF rises above the voltage Vdd/2 and so the signal Up/Down becomes a logical high. Note that slightly after the time t0, the signal becomes briefly inactive, however due to the effect of the low pass filter, the signal LPF does not drop below Vdd/2, and so the output Up/Down remains high. At a time t1, the signal becomes inactive, and so LPF falls below Vdd/2 and so the output Up/Down goes to a low logical level. Just before a time t2, the signal begins activating, but because of the effects of the filter, the signal LPF does not immediately change and does not rise above Vdd/2 until t2. At the time t2, the result signal Up/Down becomes active.

Figure 5:
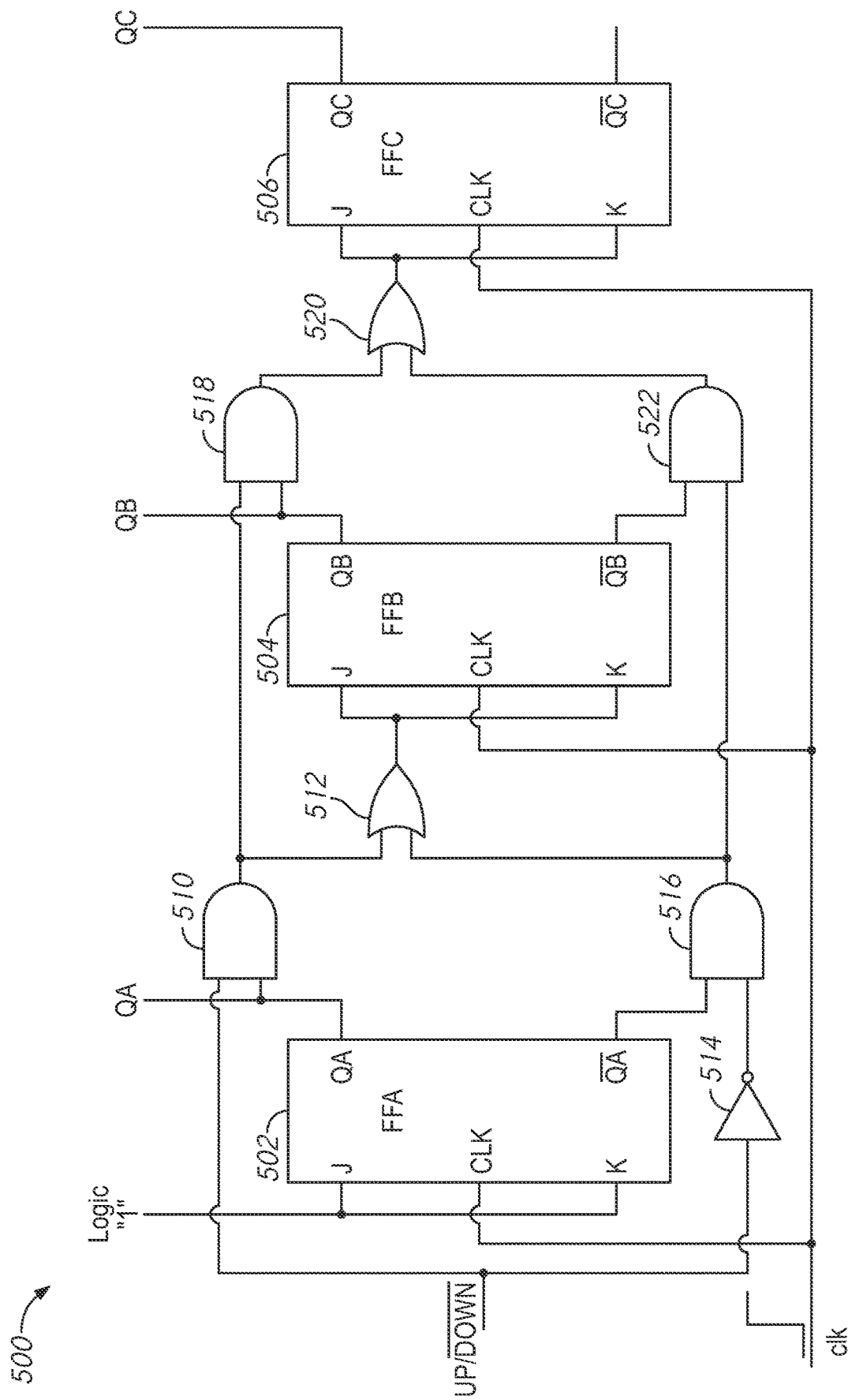
FIG. 5 is a schematic diagram of a bi-directional counter circuit according to some embodiments of the present disclosure.

FIG. 5 is a schematic diagram of a bi-directional counter circuit according to some embodiments of the present disclosure. The bi-directional counter circuit 500 may, in some embodiments, implement the counter circuit 204 of FIG. 2. The example counter circuit 500 is a three-bit bi-directional counter, however, more or fewer bits may be used in other example embodiments.

The counter circuit 500 includes three flip-flops 502, 504, and 506, each of which stores a respective bit of the count value (e.g., Count of FIG. 2) QA, QB, and QC. The bit QA stored in the flip-flop 502 may be a least significant bit of Count, and the bit QC stored in the flip-flop 506 may be the most significant bit. Each of the flip-flops 502, 504, and 506 has a clock terminal coupled to the clock signal clk.

The flip-flop 502 has an input terminals J and K coupled to a voltage which represents a logical high (e.g., Vdd). A clock terminal of the flip-flop 502 is coupled to the clock signal clk (e.g., srefosc). Accordingly, each time the clock signal clk activates (e.g., each rising edge of clk), the value of QA stored in the flip-flop 502 may change its state. An AND gate has input terminals coupled to the count adjust signal Up/Down (e.g., provided by filter 202 of FIG. 2 and/or 300 of FIG. 3) and to the bit QA. The AND gate provides an output to an OR gate 512. The count adjust signal Up/Down is also provided through an inverter circuit 514 to an AND gate 516. The AND gate has a second input coupled to the inverse of QA. The output of the AND gate is provided to an input of the OR gate 512. The output of the OR gate is coupled to the input terminals J and K of the second flip-flop 504. Accordingly, the value of QB may change states either when both Up/Down and QA are active or when both Up/Down and QB are low with timing based on clk.

The second bit QB is provided as an input to AND gate 518. The second input of the AND gate 518 is coupled to the output of the AND gate 510 (which is active when both QA and Up/Down are active). An output of the AND gate 518 is provided as an input to OR gate 520. An AND gate 522 receives as inputs the output of AND gate 516 (which is active when both QA and Up/Down are inactive) and the inverse of QB. The outputs of the AND gates 518 and 522 are provided as inputs to an OR gate 520, which has an output terminal coupled to the inputs J and K of the third flip-flop 506. Accordingly, with timing based on clk, the state of QC will change when Up/Down, QA, and QB are all active, or when Up/Down, QA, and QB are all inactive.

Figure 6:
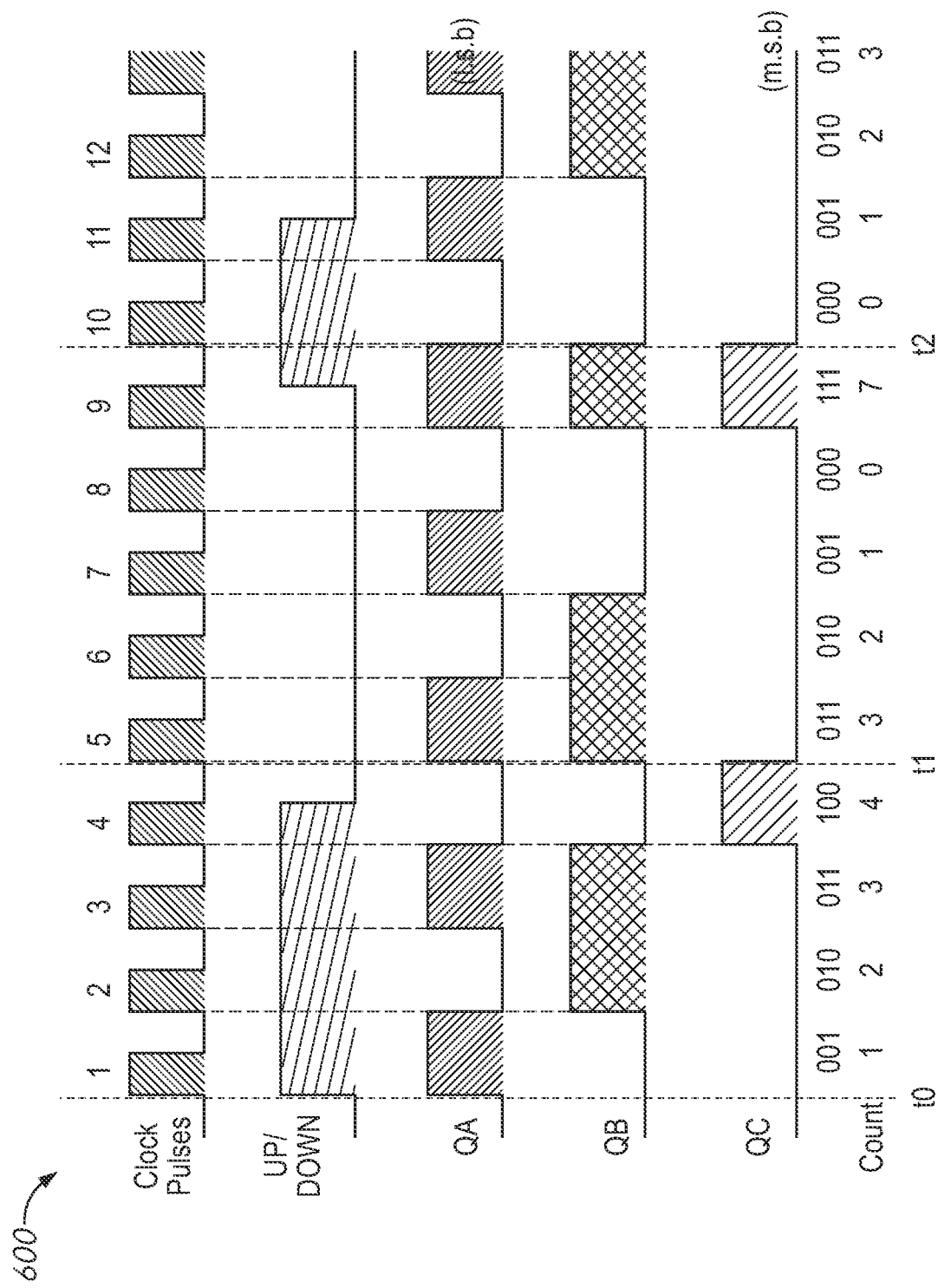
FIG. 6 is a timing diagram of an example operation of a counter circuit according to some embodiments of the present disclosure.

FIG. 6 is a timing diagram of an example operation of a counter circuit according to some embodiments of the present disclosure. The timing diagram 600 may, in some embodiments, represent the operation of a bi-directional counter circuit, such as the counter circuit 204 of FIG. 2 and/or 500 of FIG. 5. In particular, the timing diagram 600 may represent an example implementation similar to the one of FIG. 5, where a three-bit counter circuit is used.

The timing diagram 600 shows an example set of clock pulses (e.g., clk of FIGS. 2 and/or 5) along with an example count adjust signal Up/Down. Before an initial time t0, the count value may be at a minimum (000). At an initial time t0, since the count adjust signal Up/Down is active, the count increases to a value of '1' (001). With each tick of the clock signal, the count may continue to increase, until a time t1, where the count adjust signal Up/Down has become inactive. Starting at the time t1, with each tick of the clock signal the count may decrease. At a time t2, the count adjust signal has become active again, and the count value may increase. In this way, the count value may generally increase with each tick of clock while the count adjust signal Up/Down is active and decrease with each tick while the count adjust signal Up/Down is inactive.

Figure 7:
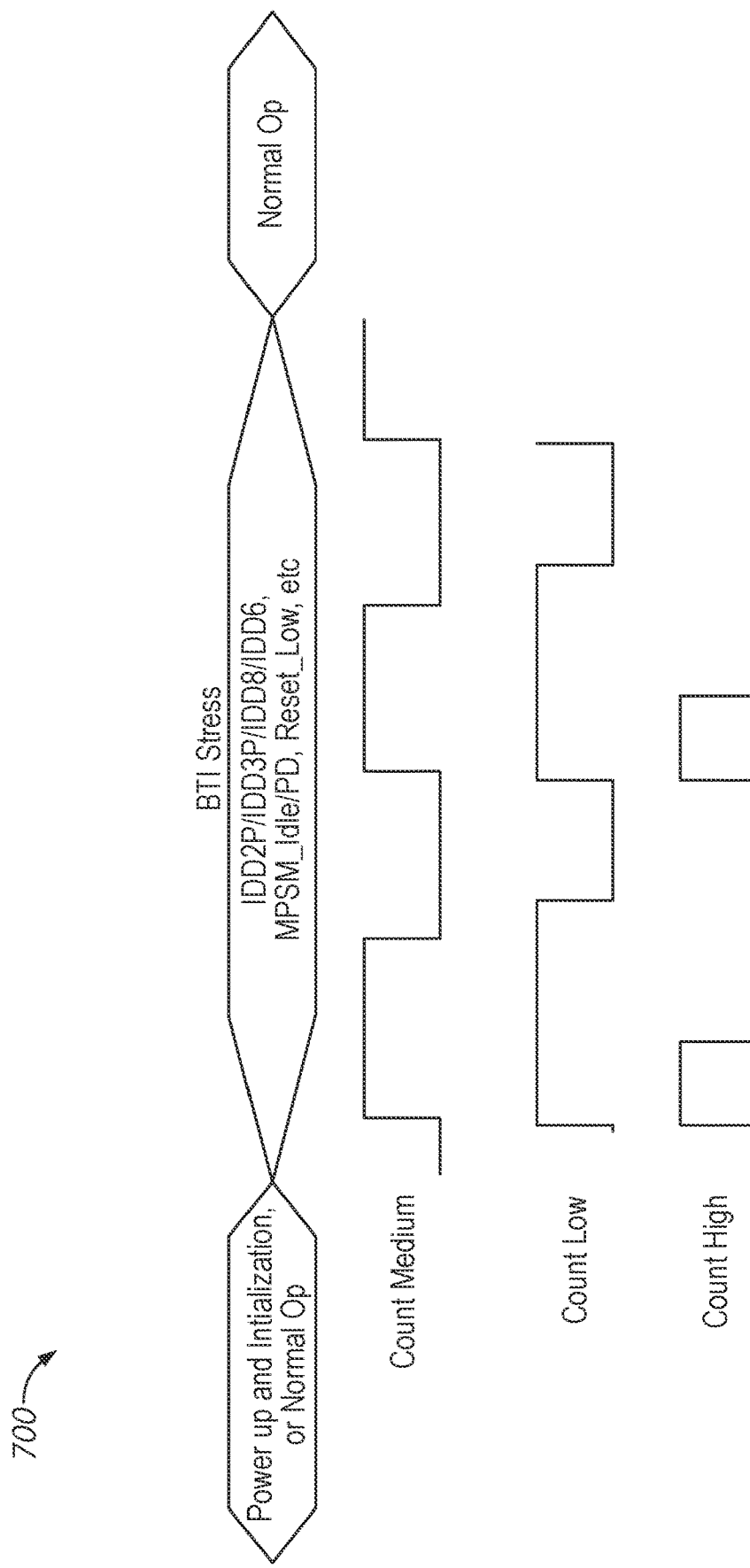
FIG. 7 is a timing diagram of examples of different BTI toggle signal duty cycles according to some embodiments of the present disclosure.

FIG. 7 is a timing diagram of examples of different BTI toggle signal duty cycles according to some embodiments of the present disclosure. The timing diagram 700 may represent different example operations of a BTI logic circuit, such as the BTI logic circuits 131 of FIG. 1 and/or 200 of FIG. 2. The timing diagram 700 shows a standby mode of the device, bordered by two normal operational modes. The timing diagram 700 shows three different BTI toggle signals, each representing a different duty cycle which may be used responsive to a different count value (e.g., Count of FIG. 2).

Each of the three example BTI toggle signals may have a same period. However, the different BTI_toggle signals may have different duty cycles based on the value count. The three traces of BTI_toggle signals may represent a same signal which is produced under different conditions based on the value of the count when the normal mode ends. When the count value has a middle value (e.g., roughly halfway between a maximum and minimum value), then the duty cycle of BTI toggle may be about 50%. When the count value is low, the duty cycle of BTI_toggle may be increased. When the count value is high, the duty cycle of BTI_toggle may be decreased.

Figure 8:
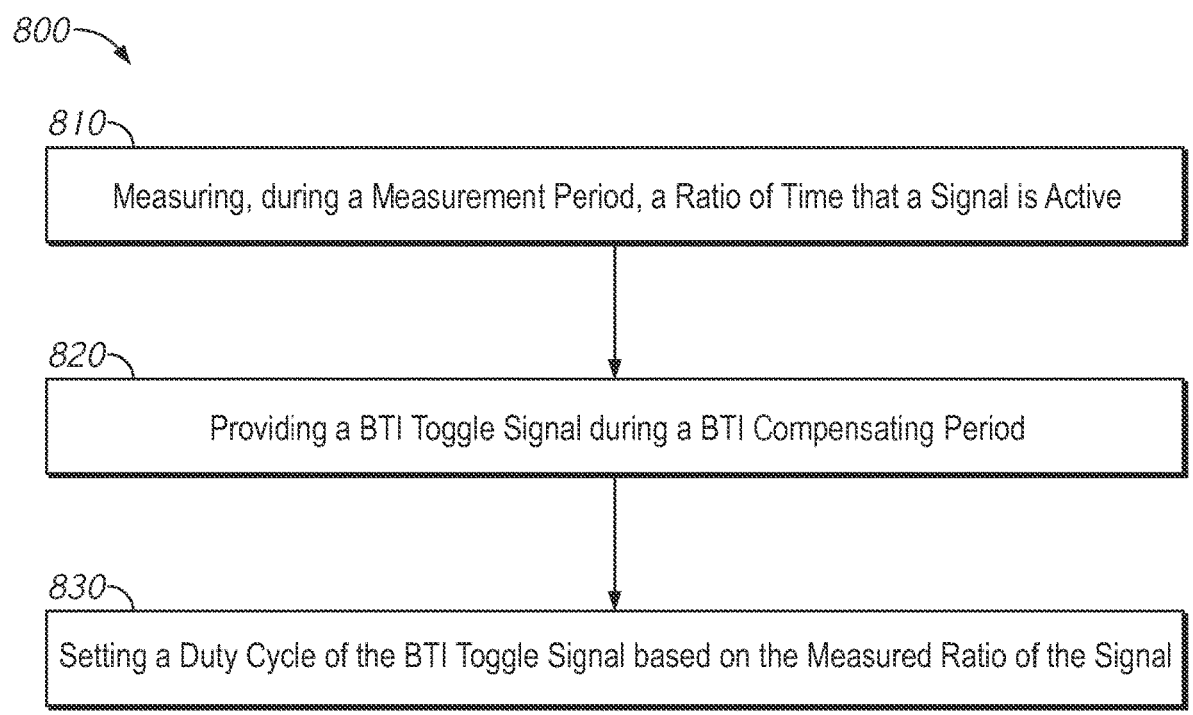
FIG. 8 is a flow chart of a method according to some embodiments of the present disclosure.

FIG. 8 is a flow chart of a method according to some embodiments of the present disclosure. The method 800 may, in some embodiments, be implemented by one or more of the circuits described with respect to FIGS. 1-3 and 5.

The method 800 includes box 810 which describes measuring, during a measurement period, a ratio of time that a signal is active. The method 800 may include measuring with a BTI logic circuit (e.g., 200 of FIG. 2). In some example embodiments, the signal may represent a signal such as a high speed clock signal (e.g., a data clock) and/or a command such as a read/write command. The method 800 may include performing access operations on a memory array during a normal operational period (e.g., which may also be part of a measurement period). The method 800 may include performing the access operations, based at least in part, on the signal.

The measuring described in box 810 may include changing a count value responsive to a count adjust signal based on the signal (e.g., with counter circuit 204 of FIG. 2). For example, the method 800 may include filtering the signal and setting a level of the count adjust signal based on whether the filtered signal is above or below a reference voltage (e.g, with filter 202 of FIG. 2). The method 800 may include adjusting the count value with in a first direction when the count adjust signal is active (e.g, a high logical level), and adjusting the count value in a second direction when the count adjust signal is inactive (e.g., a low logical level). The method 800 may include adjusting the count with timing based on a clock signal (e.g., clk of FIG. 2), which may be a self-refresh clock.

Box 810 may generally be followed by box 820, which describes providing a BTI toggle signal during a BTI compensating period. The BTI compensating period may occur during a BTI stress mode of the device. The BTI stress mode may follow the power up and initialization or, normal operational period. The method 800 may include generating the BTI toggle signal as a periodic signal. The method 800 may include providing the BTI toggle signal along a path instead of the signal during the BTI compensating period. For example providing the BTI toggle signal to a clock path instead of a clock signal or providing the BTI toggle signal to a command path instead of a command.

The method 800 includes box 830 which describes setting a duty cycle of the BTI toggle signal based on the measured ratio of the signal. The method 800 may include lowering the duty cycle responsive to the signal being mostly active and raising the duty cycle responsive to the signal being mostly inactive. For example, a judgement circuit (e.g., 206) may receive the count value and select a duty cycle based on the count value. The method 800 may include selecting a lower duty cycle for the BTI toggle signal if the count value is high (e.g., the signal was mostly active during the measurement period) and selecting a higher duty cycle for the BTI toggle signal if the count value is low (e.g., the signal mostly inactive during the measurement period). The method 800 may include generating the BTI toggle signal (e.g., with the BTI toggle engine 208 of FIG. 2) with a duty cycle based on the selected duty cycle.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims

What is claimed is:

1. An apparatus comprising:
a bias temperature instability (BTI) circuit configured to receive a signal during a measurement period of the apparatus and measure a ratio of time the signal is active to inactive during the measurement period of the apparatus, wherein the BTI circuit is further configured to set a duty cycle of a BTI toggle signal based on the measured ratio of the signal and provide the BTI toggle signal during a BTI compensating period, wherein the measurement period and the BTI compensating period occur during a mode of the apparatus with BTI stress.

2. The apparatus of claim 1, further comprising a multiplexer configured to provide the signal to a path during the measurement period and provide the BTI toggle signal to the path during the BTI compensating period.

3. The apparatus of claim 2, wherein the signal is a clock signal and the path is a clock path.

4. An apparatus comprising:
a bias temperature instability (BTI) circuit configured to receive a signal during a measurement period of the apparatus and measure a ratio of time the signal is active to inactive during the measurement period of the apparatus, wherein the BTI circuit is further configured to set a duty cycle of a BTI toggle signal based on the measured ratio of the signal and provide the BTI toggle signal during a BTI compensating period, wherein the BTI circuit includes:
a bi-directional counter configured to change a count value in a first direction based on when the signal is active and change the count value in a second direction opposite the first direction based on when the signal is inactive, wherein the duty cycle is selected based on the count value.

5. The apparatus of claim 4, wherein the BTI circuit further includes a judgement circuit configured to set the duty cycle of the BTI toggle signal based on the count value.

6. The apparatus of claim 4, wherein the BTI circuit includes a filter circuit configured to generate a count adjust signal based on the signal, wherein the filter circuit includes a low pass filter and wherein the bi-directional counter is configured to change the count value in the first direction responsive to the count adjust signal being active and configured to change the count value in the second direction responsive to the count adjust signal being inactive.

7. An apparatus comprising:
- a filter circuit configured to receive a signal and provide a count adjust signal with a level based on a level of the signal;
- a bi-directional counter circuit configured to adjust a count value responsive to the level of the count adjust signal;
- a judgement circuit configured to set a duty cycle of a BTI toggle signal based on the count value;
- a BTI toggle engine circuit configured to provide the BTI toggle signal with the duty cycle.

8. The apparatus of claim 7, wherein the counter circuit is configured to increase the count value when the count adjust signal is active with timing based on a clock signal, and configured to decreases count value when the count adjust signal is inactive with timing based on the clock signal.

9. The apparatus of claim 8, wherein the clock signal is a self-refresh clock.

10. The apparatus of claim 7, wherein the filter circuit includes:
- a low pass filter configured to provide a filtered signal based on the signal; and
- a comparator circuit configured to provide the count adjust signal at an active level when the filtered signal is above a reference voltage and configured to provide the count adjust signal at an inactive level when the filtered signal is below the reference voltage.

11. The apparatus of claim 7, wherein the judgement circuit configured to set a first duty cycle of the BTI toggle signal when the count value is above a first threshold, set a second duty cycle when the count value is below a second threshold and set a third duty cycle when the count value is between the first and the second threshold.

12. The apparatus of claim 7, wherein the filter circuit is configured to receive the signal during a first period, and wherein the BTI toggle engine is configured to provide the BTI toggle signal during a second period.

13. The apparatus of claim 12, wherein the counter circuit is configured to reset the count value during the second period.

14. A method comprising:
- measuring, during a measurement period, a ratio of time that a signal is active;
- providing a BTI toggle signal during a BTI compensating period; and
- setting a duty cycle of the BTI toggle signal based on the measured ratio of the signal;
- increasing the duty cycle responsive to the measured ratio being low; and
- decreasing the duty cycle responsive to the measured ratio being high.

15. The method of claim 14, further comprising accessing a memory array based, at least in part, on the signal during a normal operational period.

16. The method of claim 14, further comprising providing the signal to a path during the measurement period and providing the BTI toggle signal to the path during the BTI compensating period.

17. A method comprising:
- measuring, during a measurement period, a ratio of time that a signal is active;
- providing a BTI toggle signal during a BTI compensating period;
- setting a duty cycle of the BTI toggle signal based on the measured ratio of the signal;
- generating a count adjust signal based on the signal;
- changing a count value based on the count adjust signal; and
- selecting the duty cycle based on the count value.

18. The method of claim 17, further comprising:
- filtering the signal with a low pass filter to generate a filtered signal;
- comparing the filtered signal to a reference voltage; and
- generating the count adjust signal based on the comparison of the filtered signal to the reference voltage.

* * * * *